United States Patent [19]

Yanagisawa et al.

[11] Patent Number: 5,407,858
[45] Date of Patent: Apr. 18, 1995

[54] METHOD OF MAKING GAP RED LIGHT EMITTING ELEMENT SUBSTRATE BY LPE

[75] Inventors: Munehisa Yanagisawa, Takasaki; Yuuki Tamura; Susumu Arisaka, both of Annaka; Hidetoshi Matsumoto, Matsuida, all of Japan

[73] Assignee: Shin-Etsu Handotai Co. Ltd., Tokyo, Japan

[21] Appl. No.: 229,690

[22] Filed: Apr. 12, 1994

[30] Foreign Application Priority Data

Apr. 12, 1993 [JP] Japan .................................. 5-109963

[51] Int. Cl.$^6$ .......................................... H01L 21/208
[52] U.S. Cl. ..................................... 437/130; 437/119; 437/120; 437/125; 437/248; 117/54; 117/74; 117/80
[58] Field of Search ................ 437/119, 120, 125, 130, 437/248; 148/DIG. 66, DIG. 101; 117/54, 74, 80

[56] References Cited

U.S. PATENT DOCUMENTS 3,951,700  4/1976  Beppu et al. ............................ 117/54
4,017,880  4/1977  Kasami et al. ........................ 437/130
4,300,960  11/1981  Koike et al. ........................ 437/130

FOREIGN PATENT DOCUMENTS 0151386  10/1981  German Dem. Rep. ............ 437/151
0094678  7/1981  Japan ..................................... 437/130

Primary Examiner—R. Bruce Breneman
Assistant Examiner—Ramamohan R. Paladugu
Attorney, Agent, or Firm—Ronald R. Snider

[57] ABSTRACT

To provide a GaP red light emitting element substrate which a large amount of oxygen is doped in the p-type GaP layer, and which very few $Ga_2O_3$ precipitates develop on and/or in p-type GaP layer, and methods of manufacturing said substrate. After the n-type GaP layer 2 is grown on the n-type GaP single crystal substrate 1, when forming the p-type GaP layer 3 doped with Zn and O, on said n-type GaP layer 2 by means of the liquid phase epitaxial growth method, the p-type GaP layer 3 is grown by using a Ga solution with a high concentration of oxygen, and said Ga solution is removed from the substrate 1 to complete the growth when the temperature is lowered to a prescribed temperature of 980° C. or higher. When the temperature has reached the prescribed temperature of 980° C. or higher during the growth using the Ga solution with a high concentration of oxygen, it is also possible to treat said Ga solution to decrease the concentration of the contained oxygen and then continue the growth. It is also possible to conduct the growth using the Ga solution with a high concentration of oxygen until the temperature reaches the prescribed temperature of 980° C. or higher, and then, after switching the growth solution to a Ga solution with a low concentration of oxygen, continue the growth.

7 Claims, 7 Drawing Sheets

METHOD OF MAKING GAP RED LIGHT EMITTING ELEMENT SUBSTRATE BY LPE

BACKGROUND OF THE INVENTION

1. Field of the Invention

This invention relates to methods of manufacturing a GaP light emitting element substrate, and more precisely to a substrate (hereafter referred to as "GaP red light emitting element substrate") comprising a plurality of GaP layers formed on a GaP single crystal substrate which is used to manufacture GaP light emitting elements, and methods of manufacturing it.

2. The Prior Art

Light emitting elements such as light emitting diodes are obtained normally by layering a plurality of semiconductor layers on a semiconductor single crystal substrate to prepare a multi-layer semiconductor element substrate with a pn junction, and making it into elements. Of these, GaP red light emitting elements can be obtained by using a GaP red light emitting element substrate prepared by forming one or more layers of n-type and p-type GaP layers, one after another, on an n-type GaP single crystal substrate.

GaP has the indirect transition-type band structure, and it does not emit red light when a pn Junction is simply formed. Therefore, the p-type GaP layer(s) is doped with zinc (Zn) and oxygen (O) to form Zn-O pairs, which would be the emitting centers, in the p-type GaP layer(s). This GaP light emitting element emits red light which peak wavelength is approximately 700 nm.

As described thus far, the p-type GaP layer(s) of the GaP red light emitting element substrate is doped with Zn and O, and a higher Zn-O pair concentration would give light emitting elements with higher luminance. In order to do this, it is necessary to dope a large amount of O in this layer(s). However, there was a problem in that doping of a large amount of O gave rise to many precipitates of gallium oxide ($Ga_2O_3$) on and/or in the surface of the p-type GaP layer of the light emitting element substrate manufactured by the liquid phase epitaxial growth method, resulting in an increase in the ratio of surface failure due to the $Ga_2O_3$ precipitates.

BRIEF DESCRIPTION OF THE INVENTION

Therefore, the object of this invention is to provide a GaP red light emitting element substrate which a large amount of oxygen is doped in the p-type GaP layer(s), thus allowing the manufacture of high-luminance red light emitting elements, and which very few $Ga_2O_3$ precipitates develop on and/or in the p-type GaP layer(s), and methods of manufacturing said substrate.

In order to solve the problem mentioned above, this invention, as described in claim 1, provides a method of manufacturing a GaP red light emitting element substrate by forming, one after another, an n-type GaP layer(s), and a p-type GaP layer(s) in which Zn and O are doped, on anon-type GaP single crystal substrate by means of the liquid phase epitaxial growth method, wherein, when a Ga solution with a enough high concentration of oxygen for liquid phase epitaxial growth to give high luminance is placed on the n-type multi-layer GaP substrate obtained by forming said n-type GaP layer(s) on said n-type GaP single crystal substrate, and the temperature of said Ga solution with a high contcentration of oxygen for liquid phase epitaxial growth is lowered to grow said p-type GaP layer(s), then the growth completion temperature is set to a prescribed temperature of 980° C. or higher, and said Ga solution with a high concentration of oxygen for liquid phase epitaxial growth is removed, at said growth completion temperature, from the light emitting element substrate obtained by growing said p-type GaP layer(s) on said n-type multi-layer GaP substrate.

The $Ga_2O_3$ content of said Ga solution with a high concentration of oxygen for liquid phase epitaxial growth is 0.35 wt % or higher.

This invention, as described in claim 3, also provides a method of manufacturing a GaP red light emitting element substrate by forming, one after another, an n-type GaP layer(s), and a p-type GaP layer(s) in which Zn and O are doped, on an n-type GaP single crystal substrate by means of the liquid phase epitaxial growth method, wherein, during the process of growing said p-type GaP layer(s), a) the Ga solution with a enough high concentration of oxygen for liquid phase epitaxial growth to give high luminance is placed on the n-type multi-layer GaP substrate obtained by forming said n-type GaP layer(s) on said n-type GaP single crystal substrate, b) the temperature of said Ga solution with a high concetration of oxygen for liquid phase epitaxial growth is lowered to grow said p-type GaP layer(s), c) when the temperature is lowered to the prescribed temperature of 980° C. or higher, then said Ga solution with a high concentration of oxygen for liquid phase epitaxial growth is treated in such a way that the oxygen concentration in it decreases, and d) the growth of said p-type GaP layer(s) is then continued by further lowering the temperature of the Ga solution with a lower concentration of oxygen for liquid phase epitaxial growth due to said treatment.

For said treatment for decreasing the concentration of the contained oxygen, a heat treatment at a reduced pressure or in a hydrogen gas flow, for example, is conducted. It is also possible to continue to lower the temperature of said Ga solution for the liquid phase epitaxial growth while this treatment is being conducted. Said Ga solution with a high concentration of oxygen for liquid phase epitaxial growth has 0.35 wt % or more of $Ga_2O_3$, and the concentration of the contained oxygen, expressed as a $Ga_2O_3$ concentration, is lowered to 0.2 wt % or less by said treatment for decreasing the concentration of the contained oxygen.

To give a concrete example, let us suppose the growth starting temperature (which is the same as the temperature at which the temperature lowering process starts) is approximately 1050° C. At one temperature point during the growth of the p-type GaP layer when the temperature has not yet reached 980° C., approximately 1000° C. for example, a heat treatment is conducted at a reduced pressure or in a hydrogen ($H_2$) gas flow to lower the concentration of oxygen contained in said Ga solution for liquid phase epitaxial growth to or below a concentration at which "very few of said $Ga_2O_3$ precipitates develop on and/or in the p-type GaP layer" (0.2 wt % or less, expressed as a $Ga_2O_3$ concentration), and then the growth of the p-type GaP layer is resumed to obtain a p-type GaP layer with a prescribed thickness (approximately 60 micrometers).

This invention, as described in claim 7, also provides a method of manufacturing a GaP red light emitting element substrate by forming, one after another, an n-type GaP layer(s), and a p-type GaP layer(s) in which Zn and O are doped, on an n-type GaP single crystal substrate by means of the liquid phase epitaxial growth method, wherein, during the process of growing said p-type GaP layer(s), a) a Ga solution with a high concentration of oxygen for liquid phase epitaxial growth (hereafter referred to as "the first Ga solution") is placed on the n-type multi-layer GaP substrate obtained by forming said n-type GaP layer(s) on said n-type GaP single crystal substrate, b) the temperature of said first Ga solution is lowered to grow a p-type GaP layer with a high concentration of oxygen, c) said first Ga solution is removed, at a prescribed temperature of 980° C. or higher, from the base substrate obtained by growing said p-type GaP layer on said n-type multi-layer GaP substrate, d) a Ga solution with a low concentration of oxygen for liquid phase epitaxial growth (hereafter referred to as "the second Ga solution") is placed on said base substrate, and e) the temperature of said second Ga solution is lowered to grow a p-type GaP layer with a low concentration of oxygen.

Said first Ga solution contains 0.35 wt % or more $Ga_2O_3$, and said second Ga solution contains 0.2 wt % or less $Ga_2O_3$, or does not contain any $Ga_2O_3$ at all.

A concrete example follows. First, for the Ga solutions for growing the p-type GaP layers, the first Ga solution with a high concentration (0.4 wt % for example) of $Ga_2O_3$, and the second GaP solution with a low concentration (0.2 wt % for example) of $Ga_2O_3$ are prepared. A p-type GaP layer with a high concentration of oxygen is grown by using said first Ga solution, and the growth is ended at a temperature of 980° C. or higher. The growth solution is then switched to the second Ga solution, and a p-type GaP layer with a low concentration of oxygen is grown by using said second Ga solution. Here, said "high concentration of oxygen" means a enough high concentration of oxygen to allow high luminance, and said "low concentration of oxygen" means a oxygen concentration at which very few $Ga_2O_3$ precipitates develop on and/or in the p-type GaP layer.

This invention, as described in claim 9, also provides a GaP red light emitting element substrate made by forming, one after another, an n-type GaP layer(s), and a p-type GaP layer(s) in which Zn and O are doped, on an n-type GaP single crystal substrate by means of the liquid phase epitaxial growth method, wherein said p-type GaP layer comprises the first p-type GaP layer with a high concentration of oxygen and the second p-type GaP layer with a low concentration of oxygen.

Said first p-type GaP layer is formed by using a Ga solution for liquid phase epitaxial growth which contains 0.35 wt % or more $Ga_2O_3$, and said second p-type GaP layer is formed by using a Ga solution for liquid phase epitaxial growth which contains 0.2 wt % or less $Ga_2O_3$ (or does not contain any $Ga_2O_3$ at all).

DETAILED DESCRIPTION

Figure 1:
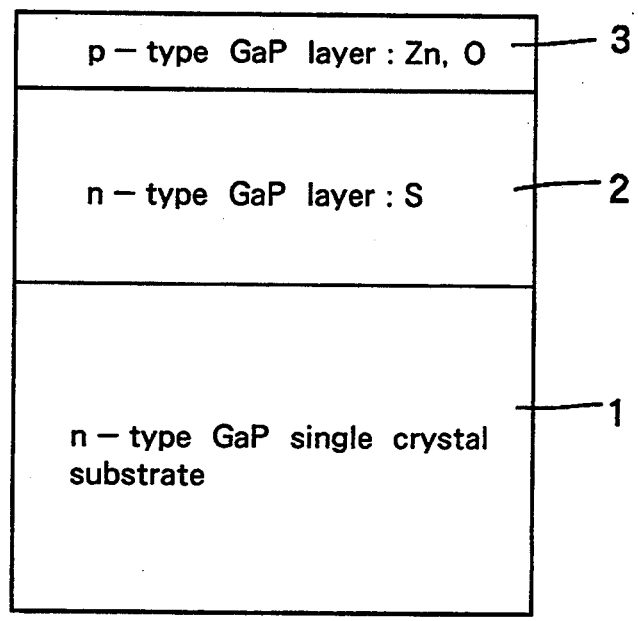
FIG. 1 shows a schematic cross section of a GaP red light emitting element Substrate obtained by the manufacturing method of an example of this invention.

Examples of this invention are described next by referring to drawings. FIG. 1 shows a schematic cross section of a GaP red light emitting element substrate obtained by the manufacturing method of one example of this invention. This GaP red light emitting element substrate comprises an n-type GaP layer 2 and a p-type GaP layer 3 formed, one after another, on an n-type GaP single crystal substrate 1. Dopants for the n-type and p-type are, for example, sulfur (S) and zinc (Zn), respectively. The p-type GaP layer 3 is doped with oxygen (O) in addition to Zn.

An example of a method of manufacturing said GaP red light emitting element substrate follows:

EXAMPLE 1

This method corresponds to the invention described in claim 1 of the Scope of the claim. An n-type single crystal grown by the liquid encapsulated Czochralski (LEC) method, for example, is made into a wafer to obtain the n-type GaP single crystal substrate 1. The GaP layers are formed on this n-type GaP single crystal 1 by means of the liquid phase epitaxial growth method. That is, after forming the n-type GaP layer 2 by means of the liquid phase epitaxial growth method, the p-type GaP layer 3 is formed by a growth program as shown in FIG. 2.

Figure 2:
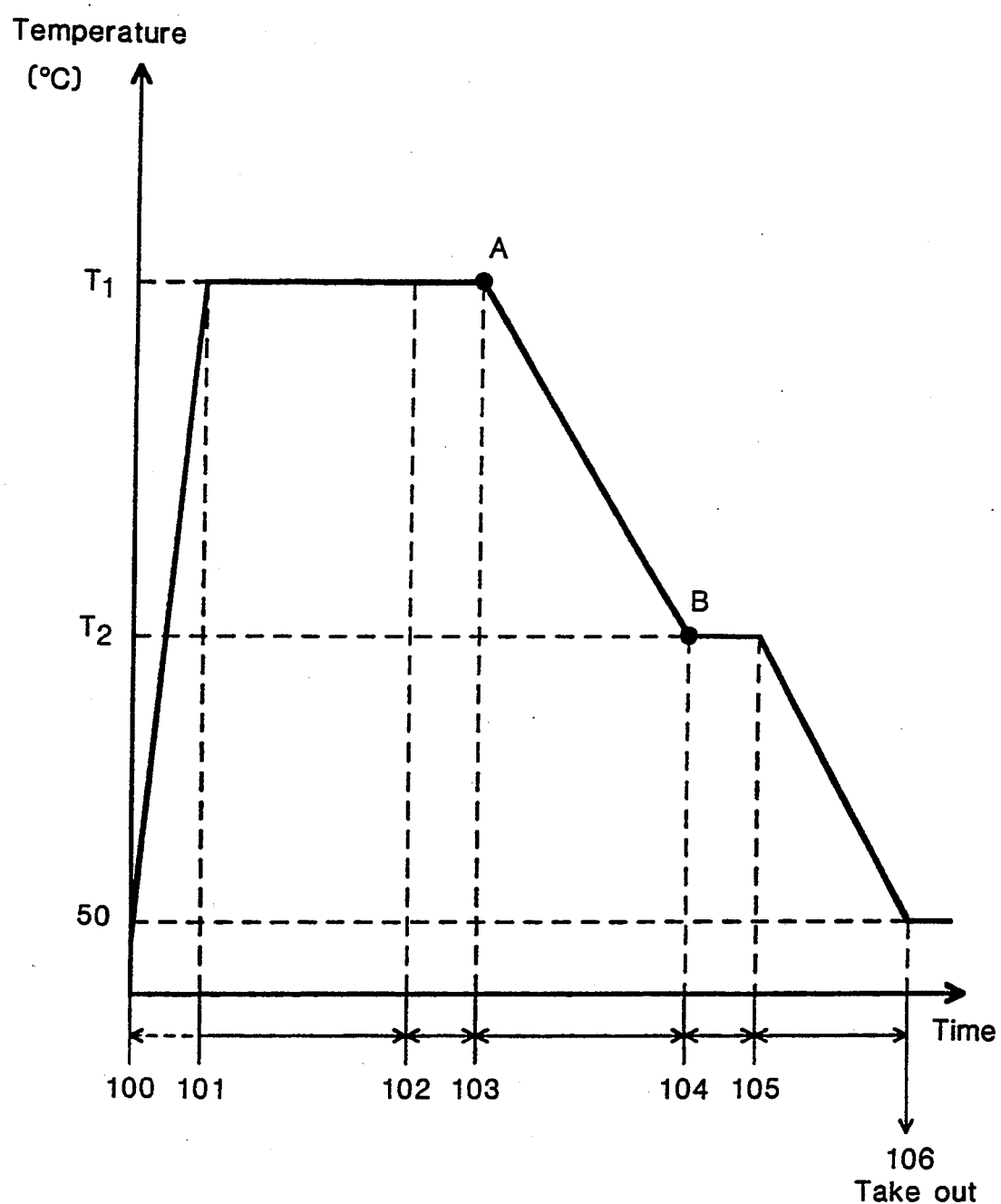
FIG. 2 shows a growth program for growing the p-type GaP layer 3 by using the method of Example 1 in this invention.

In FIG. 2, at temperature T1 which is to be the growth starting temperature of the p-type GaP layer 3 (1050° C., for example), a Ga solution in which Zn, $Ga_2O_3$ and GaP polycrystals are dissolved (a saturated Ga solution of GaP at 1050° C.) is placed on the substrate (hereafter referred to as the "n-type multi-layer GaP substrate") obtained by forming the n-type GaP layer 2 on said n-type GaP single crystal substrate 1. The temperature is then lowered from $T_1$ (the growth starting temperature, represented by point A in FIG. 2) to $T_2$ (the growth completion temperature, represented by point B in FIG. 2) to grow the p-type GaP layer 3 by depositing GaP in said Ga solution onto said n-type multi-layer GaP substrate. At this temperature $T_2$, said Ga solution is removed from the substrate. The p-type GaP layer 3 doped with Zn and O is thus formed. The substrate is then cooled down to 50° C. and taken out.

Thus, through the process described above, the GaP red light emitting element substrate comprising the n-type GaP layer 2 and the p-type GaP layer 3 formed, one after another, on the n-type GaP single crystal substrate 1 is prepared. Next, n-electrodes and p-electrodes are formed on the n-type GaP single substrate side and on the p-type GaP layer side, respectively, of this light emitting element substrate, and, after dicing, the semiconductor chip is secured on a support member. After wire bonding, the chip is encapsulated in resin to obtain a light emitting element which emits red light.

The effects of this invention were confirmed by concrete experimental examples.

EXPERIMENTAL EXAMPLE 1

The concentration of $Ga_2O_3$ added to the Ga solution 5 used for the liquid phase epitaxial growth was set to values ranging between 0.10 and 0.45 wt %, the growth starting temperature $T_1$ was set to 1050° C. and the growth completion temperature $T_2$ was set to 960° C., and, under these conditions, the p-type GaP layer 3 was grown to obtain a GaP red light emitting element substrate.

Figure 3:
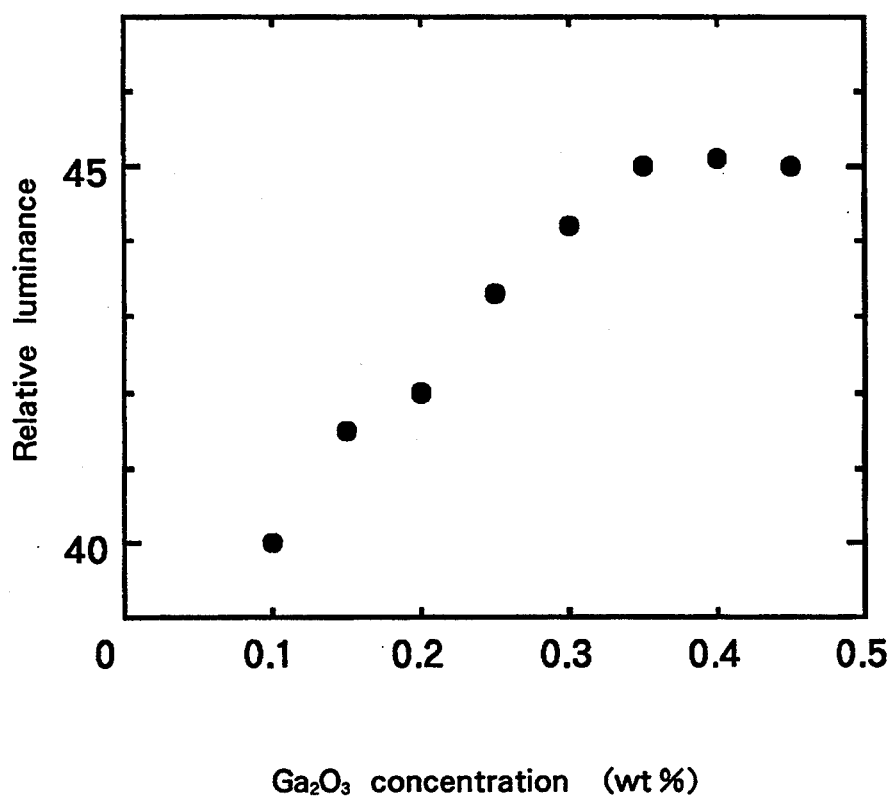
FIG. 3 shows the relationship between the $Ga_2O_3$ concentration (wt %) in the Ga solution used for the growth of the p-type GaP layer 3 and the average relative luminance of the light emitting elements.

FIG. 3 shows the relationship between the $Ga_2O_3$ concentration (wt %) in the Ga solution used for the growth of the p-type GaP layer 3 and the luminance (relative luminance) of said light emitting elements. This figure indicates that the luminance becomes higher as the $Ga_2O_3$ concentration becomes higher, and that the concentration of $Ga_2O_3$ in the Ga solution used for the liquid phase epitaxial growth must be 0.35% or higher in order to obtain high-luminance light emitting elements with a relative luminance of 45 or higher.

Figure 4:
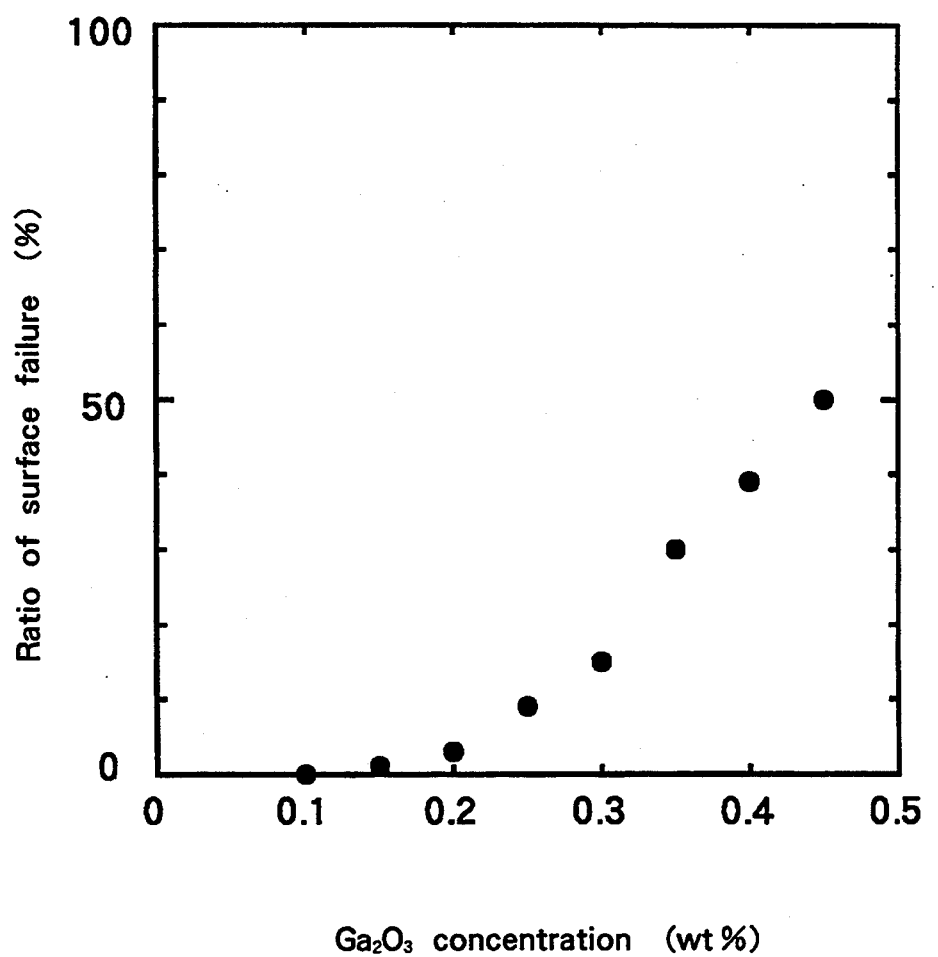
FIG. 4 shows the relationship between the $Ga_2O_3$ concentration (wt %) in the Ga solution used for the growth of the p-type GaP layer 3 and the ratio of surface failure due to $Ga_2O_3$ precipitates.

However, if the $Ga_2O_3$ concentration becomes 0.35 wt % or higher, many $Ga_2O_3$ precipitates develop on and/or in the p-type GaP layer 3, and, as shown in FIG. 4, the ratio of surface failure due to the $Ga_2O_3$ precipitates sharply increases. The ratio of surface failure (%) due to $Ga_2O_3$ precipitates is calculated as follows:

[(Number of light emitting element substrates failed due to $Ga_2O_3$ precipitates)/(Number of the n-type multi-layer GaP substrates fed into the p-type GaP layer growth process)] × 100.

A light emitting element substrate failed due to $Ga_2O_3$ precipitates is defined as a substrate which has more than $10/cm^2$ of $Ga_2O_3$ precipitates.

EXPERIMENTAL EXAMPLE 2

The concentration of $Ga_2O_3$ in the Ga solution used for the liquid phase epitaxial growth was set to 0.40 wt %, the growth starting temperature $T_1$ was set to 1050° C. and the growth completion temperature $T_2$ was set to values ranging between 940°–1000° C. and, under these conditions, the p-type GaP layer 3 was grown to obtain a GaP red light emitting element substrate.

Figure 5:
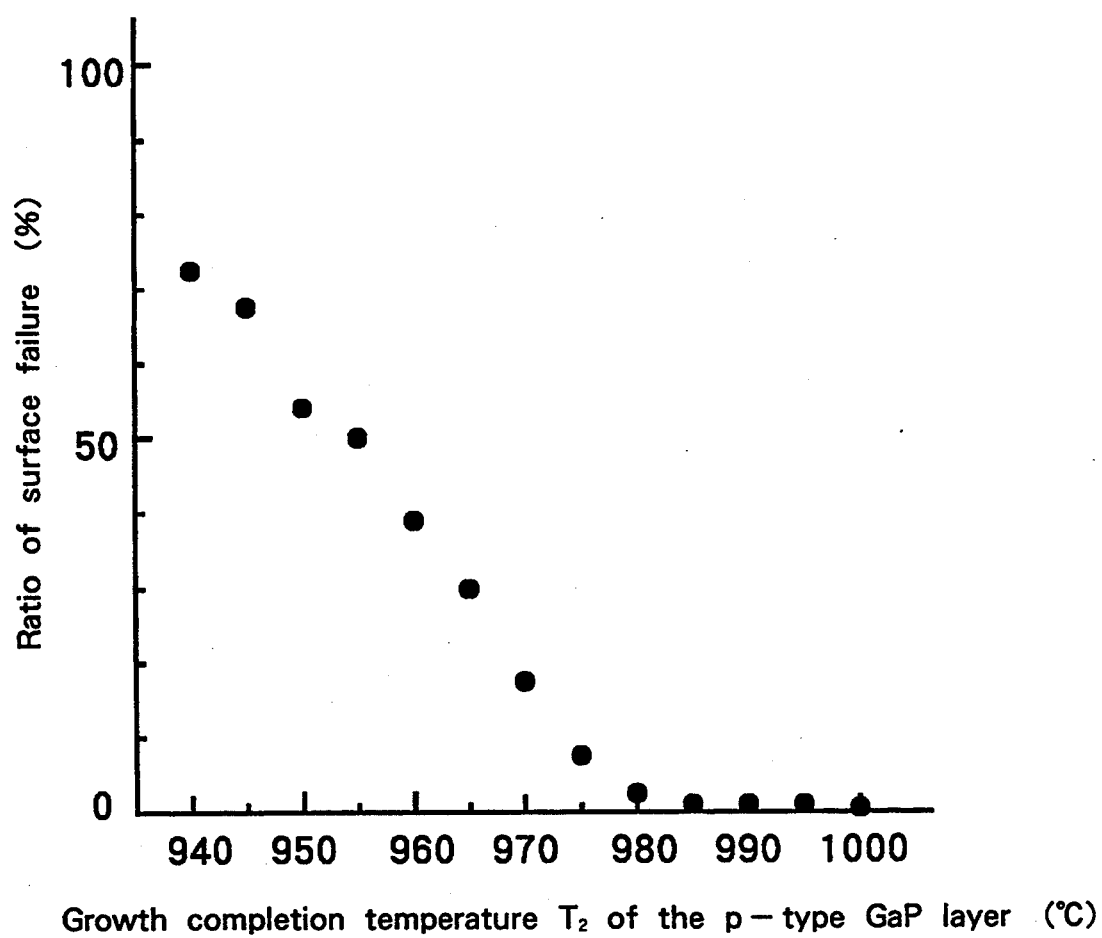
FIG. 5 shows the relationship between the growth completion temperature $T_2$ of p-type GaP layer 3 and the ratio of surface failure due to $Ga_2O_3$ precipitates.

FIG. 5 shows the relationship between the growth completion temperature $T_2$ (see FIG. 2) and the ratio of surface failure due to $Ga_2O_3$ precipitates (calculated by the same manner as in Experimental Example 1). This figure indicates that the ratio of surface failure due to $Ga_2O_3$ precipitates can be reduced to nearly zero by setting the the growth completion temperature $T_2$ of the p-type GaP layer 3 to 980° C. or higher.

Therefore, a GaP red light emitting element substrate with a good surface condition which has very few $Ga_2O_3$ precipitates in the p-type GaP layer 3, even with a large amount, 0.35 wt % or more, of $Ga_2O_3$ contained in the Ga solution (an essential condition for a high luminance) used to grow the p-type GaP layer 3, can be obtained with a high yield by setting the growth completion temperature $T_2$ of said layer 3 to 980° C. or higher. A GaP red light emitting element prepared from the GaP red light emitting element substrate obtained with the method of this experimental example 2 has an average luminance (relative luminance) of approximately 45, which is a high luminance. This agrees very well with the results of Experimental Example 1.

Examples 2 and 3, which are the same as the method of manufacturing the GaP red light emitting element substrate of Example 1 except for the fact that the growth process for the p-type GaP layer 3 is partially different, are described next. These examples correspond to the inventions described in claim 3 and claim 7, respectively, of the Scope of the claim. They share the same idea with Example 1 in that, when forming the p-type GaP layer by using a Ga solution with a high concentration (0.35 wt % or higher) of $Ga_2O_3$ which is necessary for high luminance, the completion temperature of the growth is set to 980° C. or higher.

EXAMPLE 2

Figure 6:
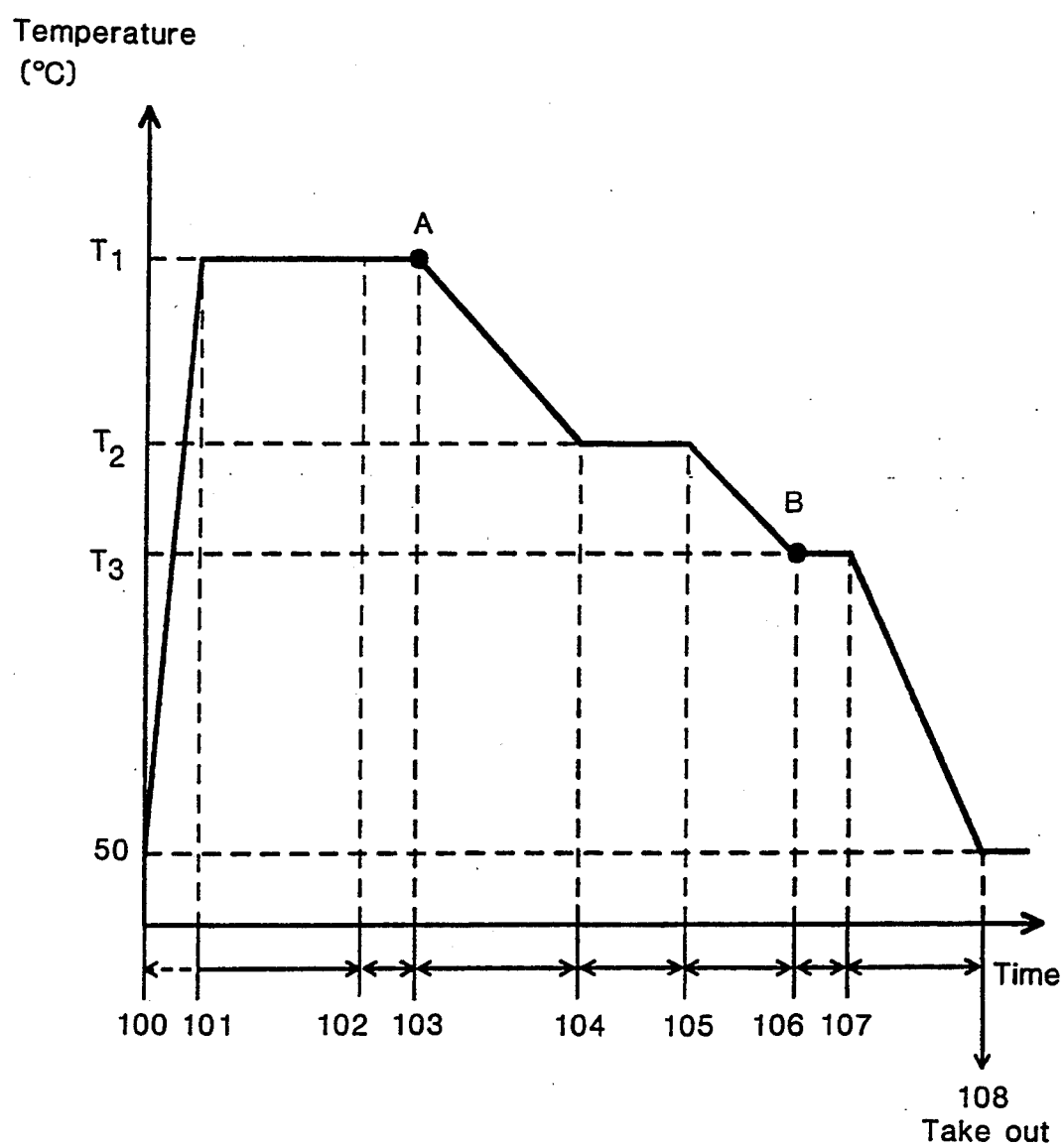
FIG. 6 shows a growth program for growing the p-type GaP layer 3 by using the method of Example 2 in this invention.
Figure 7:
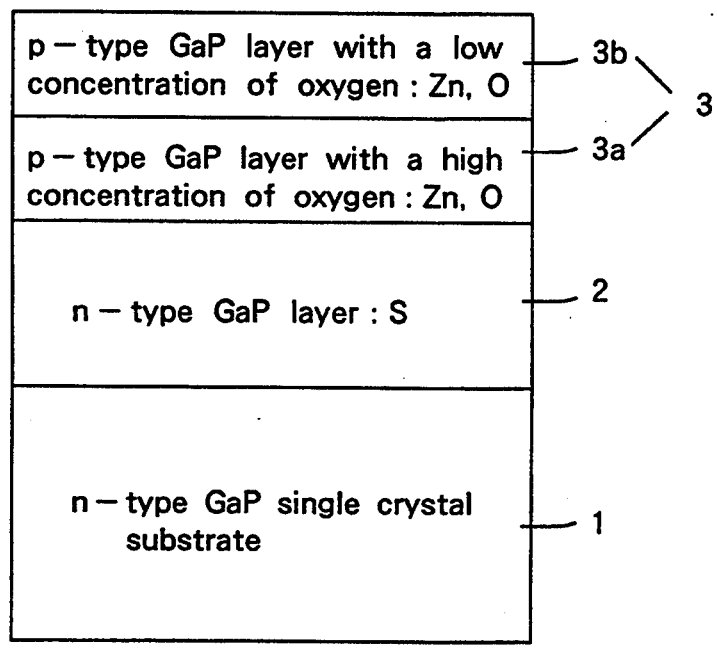
FIG. 7 shows a schematic cross section of one example of the GaP red light emitting element substrate of this invention.

In Example 2, the growth program shown in FIG. 6 was used to grow a p-type GaP layer $3a$ doped with a high concentration of oxygen and a p-type GaP layer $3b$ doped with a low concentration of oxygen, one after another, to form the p-type GaP layer 3, as shown in FIG. 7, which has a total thickness of approximately 60 micrometers. First, at 1040° C. (the growth starting temperature $T_1$, represented by point A in FIG. 6), a Ga solution for growing the p-type GaP layer which contains 0.40 wt % of $Ga_2O_3$ was placed on said n-type multi-layer GaP substrate. The temperature was then lowered from this growth starting temperature $T_1$ to 1000° C. ($T_2$, see FIG. 6) to form the p-type GaP layer $3a$ doped with a high concentration of oxygen.

At this temperature $T_2$, a heat treatment (the heat treatment for decreasing the oxygen concentration) was conducted at a reduced pressure or in a hydrogen gas flow for 1 hour or longer so that the oxygen concentration in said Ga solution was decreased to a low concentration at which "very few $Ga_2O_3$ precipitates develop on and/or in the p-type GaP layer" (0.2 wt % or less, expressed as a $Ga_2O_3$ concentration). The temperature was then further lowered to the growth completion temperature $T_3$ (850°–900° C., represented by point B in FIG. 6) to grow the p-type GaP layer $3b$ doped with the low concentration of oxygen, until the total thickness of the p-type GaP layer 3 became the prescribed value, approximately 60 micrometers. The subsequent process is the same as that in Example 1. Said heat treatment for decreasing the oxygen concentration may be conducted concurrently with the growth of the p-type GaP layer $3b$.

A GaP red light emitting element prepared from the GaP red light emitting element substrate obtained by this method had an average luminance (relative luminance) of approximately 46, which is a high luminance. The ratio of surface failure due to $Ga_2O_3$ precipitates (calculated by the same manner as in Experimental example 1 of Example 1) was less than 1%.

EXAMPLE 3

Example 3 uses, for the Ga solution for growing the p-type GaP layer, a Ga solution (hereafter referred to as "the first Ga solution") with a high concentration of $Ga_2O_3$ (0.4 wt %, for example) and a Ga solution (hereafter referred to as "the second Ga solution") with a low concentration of $Ga_2O_3$ (0.2 wt %, for example) or no $Ga_2O_3$ at all to grow the p-type GaP layer $3a$ doped with a high concentration of oxygen and the p-type GaP layer $3b$ doped with a low concentration of oxygen, one after another, to form the p-type GaP layer 3, as shown in FIG. 7, with a total thickness of approximately 60 micrometers.

First, the temperature of the first GaP solution was lowered from 1040° C. (the growth starting temperature $T_1$ for the p-type GaP layer, which is equivalent to point A in FIG. 6) to 1000° C. (equivalent to $T_2$ in Example 2) to grow the p-type GaP layer 3a doped with a high concentration of oxygen. At this temperature (1000° C.), said first Ga solution is removed from the base substrate obtained by growing said p-type GaP layer 3a on said n-type multi-layer GaP substrate, the second Ga solution was then placed on said base substrate, and next, the temperature was lowered from 1000° C. to 850°–900° C. (the growth completion temperature $T_3$ for the p-type GaP layer which is equivalent to point B in FIG. 6). to grow the p-type GaP layer 3b doped with a low concentration of oxygen until the total thickness of the p-type GaP layer 3 became the prescribed value, approximately 60 micrometers. The subsequent process was the same as that of Example 2 (see FIG. 6).

A GaP red light emitting element prepared from the GaP red light emitting element substrate obtained by this method also had an average luminance (relative luminance) of approximately 45, and the ratio of surface failure due to $Ga_2O_3$ precipitates (calculated by the same manner as in Experimental example 1 of Example 1) was less than 1%.

As described thus far, this invention allows the manufacturing of a GaP red light emitting element substrate which a large amount of oxygen is doped in the p-type GaP layer(s) and which very few $Ga_2O_3$ precipitates develop on and/or in the p-type Gap layer and, using this substrate, high luminance GaP red light emitting elements can be manufactured.

We claim:

1. A method manufacturing a GaP red light emitting element substrate by forming, one after another, an n-type GaP layer(s), and a p-type GaP layer(s) in which Zn and O are doped, on an n-type GaP single crystal substrate by means of liquid phase epitaxial growth method, wherein, when a Ga solution for liquid phase epitaxial growth is placed on the n-type multilayer GaP substrate obtained by forming said n-type GaP layer(s) on said n-type GaP single crystal substrate, and the temperature of said Ga solution for liquid phase epitaxial growth is lowered to grow GaP layer(s), then the growth completion temperature is set to a prescribed temperature of 980° C. or higher, and said Ga solution for liquid phase epitaxial growth is removed, at said growth completion temperature, from the light emitting element substrate obtained by growing said p-type GaP layer(s) on said n-type multi-layer GaP substrate, and wherein said Ga solution for liquid phase epitaxial growth contains 0.35 weight % or more of $Ga_2O_3$.

2. A method of manufacturing a GaP red light emitting element substrate by forming, one after another, an n-type GaP layer(s), and a p-type GaP layer(s) in which Zn and O are doped, on an n-type GaP single crystal substrate by means of the liquid phase epitaxial growth method, wherein, during the process of growing said p-type GaP layer(s), a) the Ga solution for liquid phase epitaxial growth is placed on the n-type multi-layer GaP substrate obtained by forming said n-type GaP layer(s) on said n-type GaP single crystal substrate, b) the temperature of said Ga solution for liquid phase epitaxial growth is lowered to grow said p-type GaP layer(s), c) when the temperature is lowered to the prescribed temperature of 980° C. or higher, then said Ga solution for liquid phase epitaxial growth is treated in such a way that its oxygen concentration decreases, and d) the growth of said p-type GaP layer(s) is then continued by further lowering the temperature of the Ga solution with a lower concentration of oxygen for liquid phase epitaxial growth due to said treatment.

3. A method of manufacturing a red GaP red light emitting element substrate as described in claims 2 wherein said treatment for decreasing the concentration of the contained oxygen comprises a heat treatment at a reduced pressure or in a hydrogen gas flow.

4. A method of manufacturing a red GaP red light emitting element substrate as described in claim 2 wherein, while said treatment for decreasing the concentration of the contained oxygen is being carried out, the growth of said p-type GaP layer(s) is continued concurrently by further lowering the temperature of the Ga solution for liquid phase epitaxial growth.

5. A method of manufacturing a GaP red light emitting element substrate as described in claim 2, wherein the Ga solution for liquid phase epitaxial growth has 0.35 wt % or more of $Ga_2O_3$ in the beginning of the growth of said p-type GaP layer(s), and the concentration of the contained oxygen, expressed as a $Ga_2O_3$ concentration, is then lowered to 0.2 wt % or less by said treatment for decreasing the concentration of the contained oxygen.

6. A method of manufacturing a GaP red light emitting element substrate by forming, one after another, an n-type GaP layer(s), and a p-type GaP layer(s) in which Zn and O are doped, on an n-type GaP single crystal substrate by means of the liquid phase epitaxial growth method, wherein, during the process of growing said p-type GaP layer(s), a) a Ga solution with a high concentration of oxygen for liquid phase epitaxial growth (hereafter referred to as "the first Ga solution") is placed on the n-type multi-layer GaP substrate obtained by forming said n-type GaP layer(s) on said n-type GaP single crystal substrate, b) the temperature of said first Ga solution is lowered to grow a p-type GaP layer with a high concentration of oxygen, c) said first Ga solution is removed, at a prescribed temperature of 980° C. or higher, from the base substrate obtained by growing said p-type GaP layer on said n-type multi-layer GaP substrate, d) a Ga solution with a low concentration of oxygen for liquid phase epitaxial growth (hereafter refeired to as "the second Ga solution") is placed on said base substrate, and e) the temperature of said second Ga solution is lowered to grow a p-type GaP layer with a low concentration of oxygen.

7. A method of manufacturing a red GaP red light emitting element substrate as described in claim 6 wherein said first Ga solution contains 0.35 wt % or more $Ga_2O_3$, and said second Ga solution contains 0.2 wt % or less $Ga_2O_3$, or does not contain any $Ga_2O_3$ at all.

* * * * *